United States Patent [19]
Li

[11] Patent Number: 5,968,267
[45] Date of Patent: Oct. 19, 1999

[54] ANTIVIBRATION SUPPORT FOR CZOCHRALSKI CRYSTAL GROWING SYSTEMS

[75] Inventor: Zhixin Li, Hudson, N.H.

[73] Assignee: General Signal Technology Corporation, Stamford, Conn.

[21] Appl. No.: 08/786,723

[22] Filed: Jan. 24, 1997

Related U.S. Application Data

[60] Provisional application No. 60/011,051, Jan. 25, 1996.
[51] Int. Cl.⁶ ..................................................... C30B 35/00
[52] U.S. Cl. ............................. 117/221; 117/208; 117/216
[58] Field of Search ................................... 117/200, 201, 117/202, 208, 216, 221

[56] References Cited

U.S. PATENT DOCUMENTS

| | | | |
|---|---|---|---|
| 4,662,860 | 5/1987 | Iseler et al. | 117/218 |
| 5,725,661 | 3/1998 | Fusegawa et al. | 117/202 |

*Primary Examiner*—Felisa Hiteshew
*Attorney, Agent, or Firm*—Kudirka & Jobse, LLP

[57] ABSTRACT

The uniformity of solid crystals grown by pulling a seed crystal from a molten charge material in a crucible is increased by eliminating vibration by supporting a housing for the solid crystal on a vibration isolator which rests on a supporting floor. Vibration isolators may also be placed between a crucible lift and rotation mechanism and the supporting floor. The crystal pull head for pulling the seed crystal also can be isolated from the remainder of the apparatus by vibration isolators.

14 Claims, 5 Drawing Sheets

ANTIVIBRATION SUPPORT FOR CZOCHRALSKI CRYSTAL GROWING SYSTEMS

RELATED APPLICATION

This application is based on a provisional U.S. patent application entitled CZOCHRALSKI CRYSTAL PULLER WITH ANTI-VIBRATION SUPPORTS FOR CZOCHRALSKI CRYSTAL GROWING SYSTEMS, filed Jan. 25, 1996 by Zhixin Li and assigned Ser. No. 60/011,051.

FIELD OF THE INVENTION

This invention relates to crystal growing systems comprising apparatus which withdraws a crystal seed from a pool of molten material to form a single crystal of the material. More particularly, this invention relates to an apparatus for improving crystal quality and uniformity.

BACKGROUND OF THE INVENTION

Several processes are known in the art for growing crystals; the Czochralski process being the most widely used of these processes. In the Czochralski process, a heated crucible holds a melted charge material from which the crystal is to be grown. The melt is maintained in the crucible at a temperature slightly above the solidification temperature of the charge material. A crystal seed is placed at one end of a cable or rod that enables the seed to be lowered into the melt material and then to be raised from the melt material together with a solid growing crystal. The seed can be either a sample of the desired crystal material or any other material that has a higher melting temperature and the same crystalline structure as the melt material in its solid form. When the seed is lowered into the melt material, it causes a local decrease in melt temperature and, as is known to those skilled in the art, this decrease results in a portion of the melt material crystallizing around and below the seed. Thereafter, the seed can be slowly withdrawn from the melt in the crucible and into a crystal growth chamber. As the seed is withdrawn, the portion of the newly formed crystal that remains within the melt essentially acts an extension of the seed and causes melt material to crystallize around and below it. This process continues as the crystal is withdrawn from the melt, resulting in crystal growth as the seed is continuously raised away from the melt.

In order to control the atmosphere surrounding the melt and the growing crystal, the crucible is located inside of a large metal vacuum chamber which is constructed of several distinct chamber sections which are joined together. These chamber sections include a growth chamber, a transition chamber and a receiving chamber. The crucible is located in the growth chamber and, at the start of the growing process the crucible is filled with charge material and the chambers are joined together and sealed. During the growing process, the crystal is withdrawn from the growth chamber and into a transition chamber located above the crucible. The crystal is finally drawn from the transition chamber into an elongated receiving chamber shaped to accommodate an extended length of crystal. When the crystal has growth so that it extends the length of the receiving chamber, the growing session is terminated, the system is cooled down, the vacuum chambers are separated and the crystal is removed from the growing apparatus. The growing apparatus, including the growth, transition and receiving chambers are large and heavy and are typically supported by a frame comprised of a plurality of columns anchored into a supporting floor.

A primary goal of crystal growing systems is to grow crystals that have uniform properties over their entire length. In order to achieve this goal, the growing conditions for the crystal must remain substantially constant throughout the growth process. A number of factors can influence the growing conditions of the crystal and these factors are carefully controlled. For example, during the growing process, the crystal is cooled by passing a cooled heat exchange fluid, such as water, through the transition chamber walls to remove heat from the crystal by heat conduction through an inert gas surrounding the crystal and by absorption of radiant heat emitted from the crystal. It is current practice also to maintain the inert gas at a controlled temperature in the receiving chamber and to circulate the gas through the transition chamber to increase cooling of the crystal as it passes from the transition chamber into the receiving chamber. The rate at which a crystal is cooled along its travel path within the crystal growing system is a prime factor to be controlled in order to produce consistent growing conditions.

The cooling rate of the crystal is determined by a number of factors. For example, the position of the melt surface relative to the crystal growing apparatus is important because this position controls the rate of cooling of the crystal from the melt temperature to the final cooled temperature. More specifically, when the path length of the pulled crystal between the melt surface and the transition chamber varies, the temperature of the crystal entering the transition chamber also changes due to the time difference that the pulled crystal emits heat during travel along this path length. As a consequence of the changing temperature of the crystal entering the transition chamber, the rate of heat extraction from the crystal also changes since the rate of heat extraction from the crystal within the transition chamber is maintained essentially constant.

It would be difficult to provide a cooling system that effects a continuously changing heat extraction rate to compensate for the constant change of melt surface height. Without compensation, the melt surface would gradually become lower as charge material is removed from the crucible and incorporated into the crystal. Accordingly, in order to maintain the melt surface height constant even though charge material is withdrawn by the growing crystal, it is common practice to gradually lift the crucible by means of a mechanical crucible lift mechanism which is supported on rigid support columns which rest on the supporting floor. In a system utilizing the Czochralski process, it is also common practice to rotate the seed about its longitudinal axis during the pulling process in order to grow a crystal with a more uniform cross section and the crucible holding the melt may also be rotated during the process for the same reason.

However, even with careful controls, it has been found that both lengthwise and cross-sectional crystal uniformity is less than is desired.

Accordingly, it is an object of the present invention to increase crystal quality and uniformity.

It is a further object of the invention to provide repeatability from one crystal growth session to the next.

It is another object of the present invention to increase crystal uniformity using conventional crystal growing equipment.

SUMMARY OF THE INVENTION

In accordance with the principles of the invention, all, or a portion, of the crystal growing apparatus is mounted on vibration dampening, or isolation, apparatus which rests on the supporting floor and reduces the transmission of mechanical vibrations into the system. Specifically, it has been found that vibrations, such as environmental and seismic vibrations, are transmitted from the supporting floor to the crucible and, thereby, to the melt by the crucible lift and rotation mechanism. In addition, it has been found that vibrations generated by the crucible lift and rotation mechanism are transmitted through the supporting floor and the supporting frame to the seed crystal. This vibrational energy causes disturbances and agitation within the melt and reduces crystal quality. Accordingly, vibration isolators are placed between the supporting frame and the floor to isolate the growing chambers and the seed crystal from vibrational energy. Vibration isolators may also be placed between the supporting floor and the crucible lift and rotation mechanism. These devices prevent transmission of vibration energy to the melt and result in improved crystal quality.

In one embodiment of this invention, one or a plurality of vibration dampers are positioned on the supporting floor to support both the working portion of the crystal growing apparatus and the supporting frame structure of the crystal growing apparatus. In this embodiment of this invention, the growing crystal is substantially isolated from vibration energy derived from forces from the environment surrounding the crystal growing apparatus, including seismic forces, are well as from vibration energy derived from movable components of the crystal growing apparatus.

In an alternative embodiment of this invention, only the working portion of the crystal growing apparatus is supported by one or more vibration isolators. As used herein, the term "working portion" of the crystal growing apparatus is meant to include the crucible and melt composition and the apparatus for moving the crucible and/or the growing crystal but excluding the housing for the growing crystal and the supporting frame structure. This embodiment is useful in geographical areas where the probability of environmental forces, such as seismic forces, vibrating the crystal growing apparatus is small. In addition, since the vibration dampening capacity in this embodiment is less then that required to dampen vibration in the entire crystal growing apparatus, the cost of the vibration isolators is substantially reduced.

The vibration isolators can comprise any conventional isolators or spring apparatus or any combination thereof. The vibration isolators are positioned to stably support the apparatus being isolated from vibration energy. It is desirable to provide at least three vibration isolators thereby to provide stable support in the horizontal plane for all of a portion of the crystal growing apparatus.

DETAILED DESCRIPTION OF THE PREFERRED EMBODIMENTS

Figures 1, 1A:
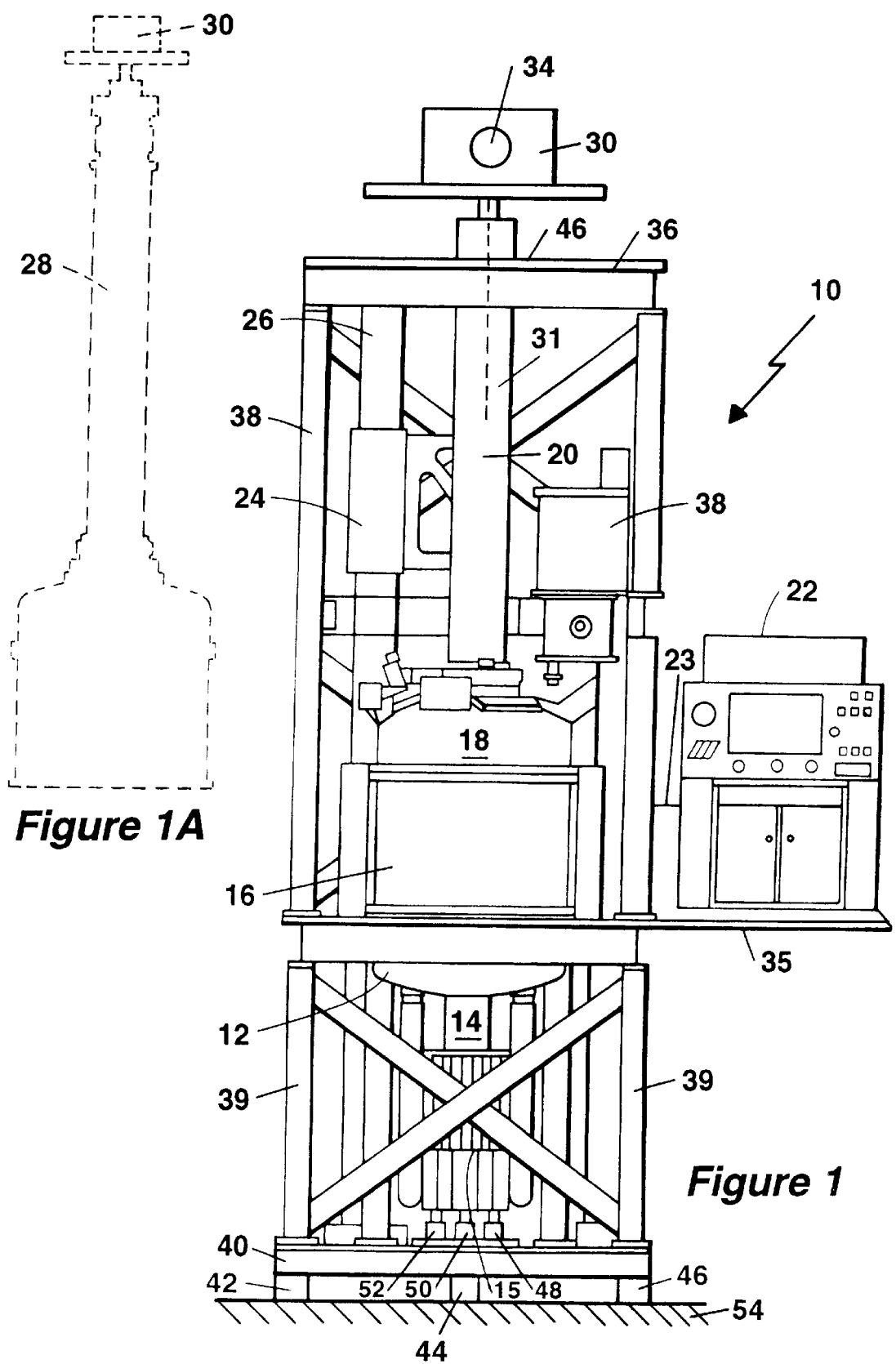
FIG. 1 is a side view of a Czochralski crystal growing apparatus utilizing the support system of this invention.
FIG. 1A is a phantom side view of a portion of the vacuum chamber positioned away from the remainder of the apparatus.

A crystal growing system which utilizes the present invention is illustrated in FIG. 1. The crystal growing system 10 includes a base chamber 12 which surrounds a crucible (not shown). A crucible lift 14 extends into the base chamber 12 and functions to adjust the position of the crucible within the base chamber 12. A motor (not shown) is provided to rotate crucible lift 14 and the crucible within base chamber 12. The crystal growing system 10 also includes a growth chamber 16 which surrounds the crucible (not shown) wherein a crystal is grown from the melted charge material. The crystal growing system 10 also includes a transition chamber 18 wherein the newly formed crystal is cooled. A receiving chamber 20 is positioned above the transition chamber 18 and houses a crystal pulling cable 31 and the cooled crystal (not shown) emerging from the transition chamber 18. A control system 22 monitors various parameters of the crystal growing process such as melt level in the crucible, the rate at which the seed crystal is withdrawn from the melt.

The crystal pulling cable 31 is also attached to a puller head 30 which is, in turn, secured to a rotating plate 32 coupled to the receiving chamber 20. The puller head 30 includes a winch 34 attached to cable 31 so that the seed crystal (not shown) and the growing crystal can be pulled into the receiving chamber 20. The plate 32 can be rotated to rotate the pull head 30, the cable 31 and the growing crystal as described above.

The various chambers 16, 18 and 20 are large and heavy and, accordingly, a lift mechanism 24 is attached to the receiving chamber 20 and can be moved along guide rod 26 under the control of the control system 22 in order to lift and rotate all, or part of, the combination 28 (FIG. 1A) of the growth chamber and the transition chamber 18 and receiving chamber 20 about the longitudinal axis of guide rod 26 to move the combination structure away from the base chamber 12, when desired, to allow for cleaning and recharging the crucible. Alternatively, the receiving chamber 20 can be moved alone by the lift apparatus 24 so that the crystal positioned within the receiving chamber 20 can be recovered.

The crystal growing system 10, including the chambers 16, 18 and 20 is held rigidly in position during the growing process by a supporting frame consisting of columns 38 and cross-piece 36. This supporting frame rests on a platform 35 which is, in turn, supported by support frame comprised of columns 39. The platform 35 also supports the control apparatus 22. Various cross braces strengthen the frame in a conventional manner.

The entire support structure is mounted on a base 40. In accordance with the principles of the invention, base 40, in turn, is mounted on a plurality of vibration isolators 42, 44 and 46, which rest on the supporting floor 54. The vibration isolators 42, 44 and 46 function to dampen vibrational energy, and isolate the crystal growing system from energy originating in the environment surrounding the system 10. This energy may include seismic energy or vibrations caused by nearby automobile traffic or other nearby machinery which is transmitted by means of the supporting floor 54 to the apparatus.

In accordance with another embodiment, additional vibration isolators (illustrated in FIGS. 4 and 5) can be provided to isolate the crucible lift and rotation mechanism 14 and its supporting columns 48, 50 and 52, in order to prevent vibration energy emanating from the lift and rotation mechanism 14 from being transmitted through base 40 and columns 39 and 38 to the pull head 30 and thereby to the growing crystal and the melt housed within chambers 16, 18 and 20. Isolators 48, 50 and 52 also prevent environmental noise from being transmitted from the supporting floor through the lift and rotation mechanism 14 to the crucible and the melt.

Figure 2:
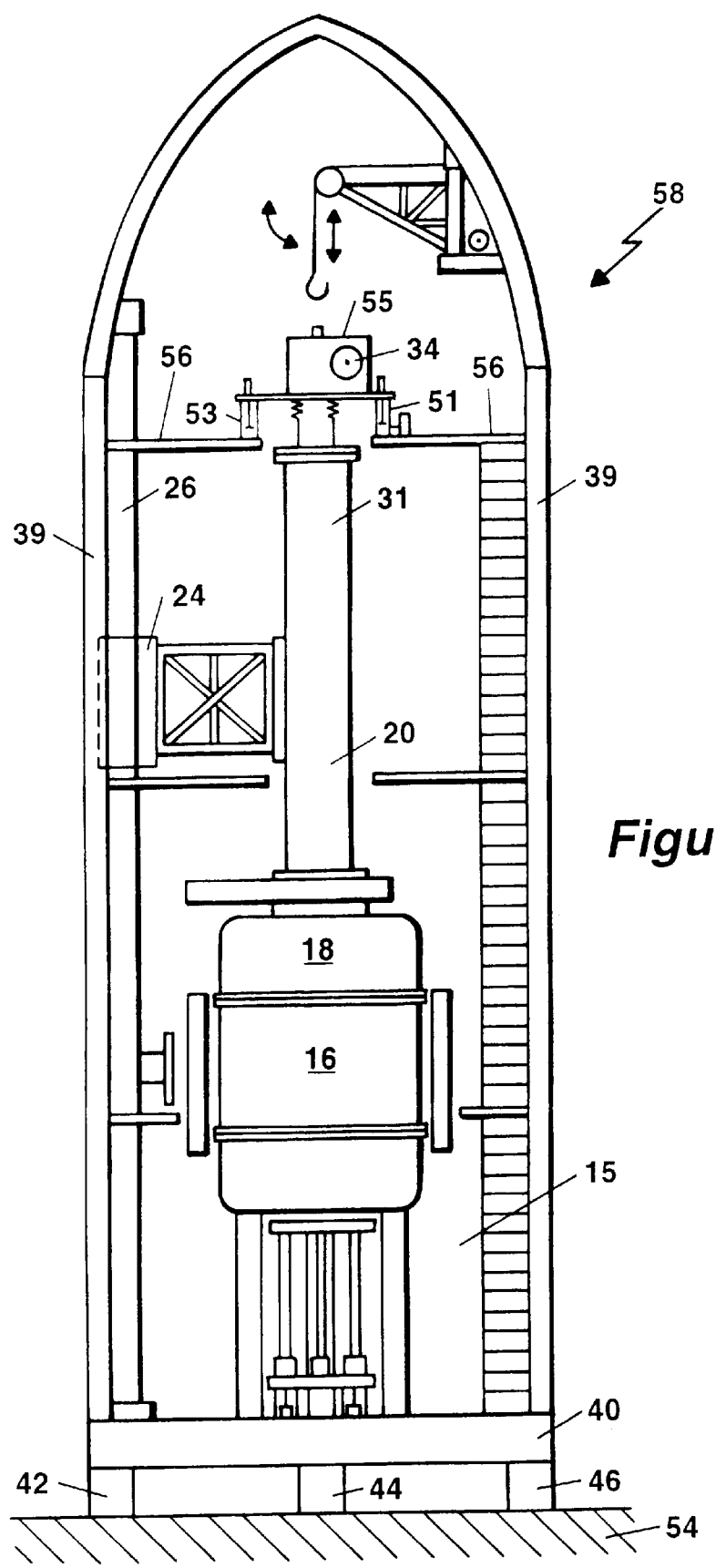
FIG. 2 is a side view of another embodiment using vibration isolators on the pull head.

Referring to FIG. 2, wherein like elements to those of FIG. 1 are designated by the same reference numerals, an embodiment of this invention is shown wherein additional vibration isolators 51 and 53 are utilized to support the pull head 55. The vibration isolators 51 and 53 are mounted on platform 56 which is part of the supporting frame. Isolators 51 and 53 serve to isolate the pull head 55 from vibrations in the supporting structure.

Figure 3:
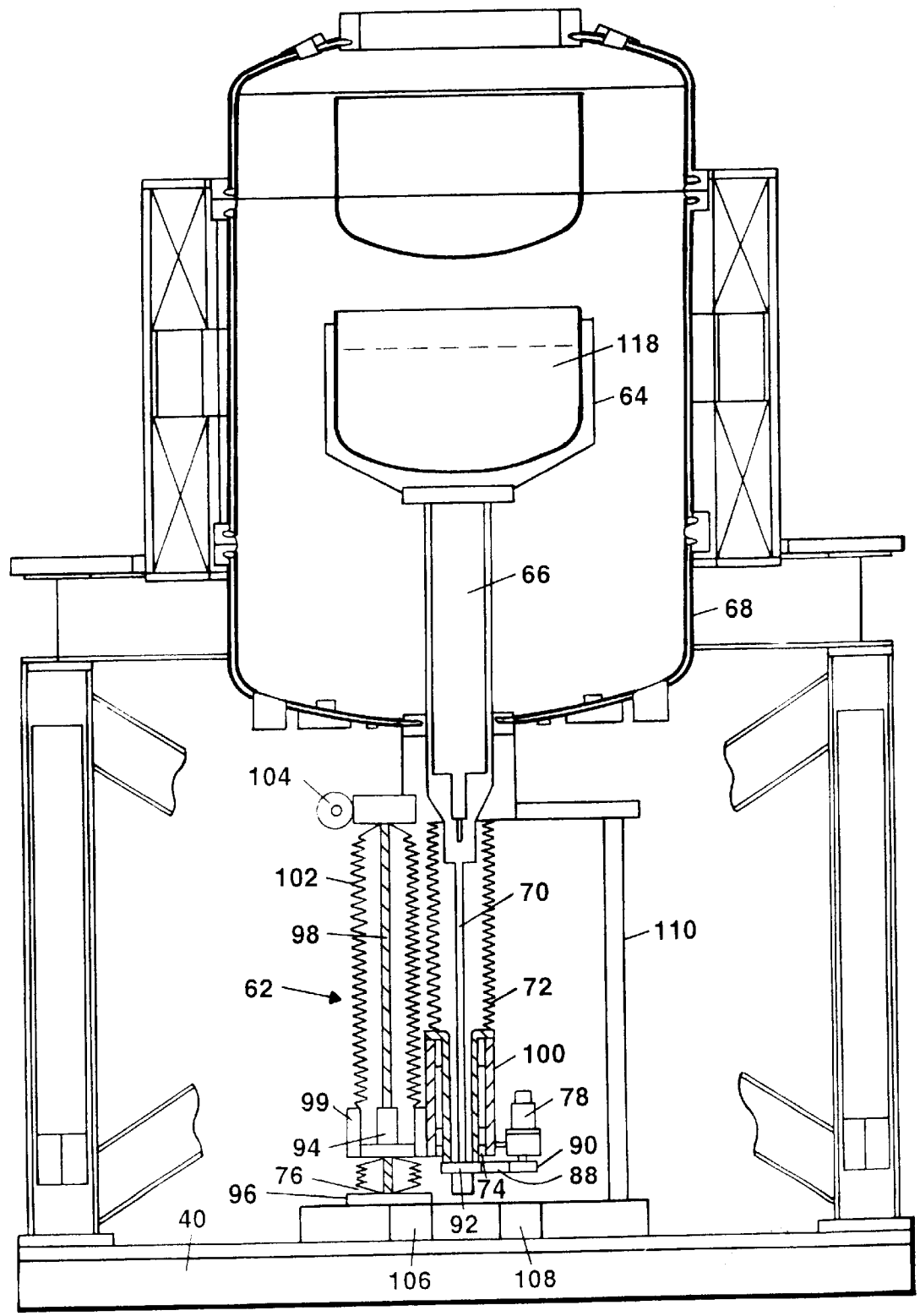
FIG. 3 is a partial cross section view showing a more detailed view of a prior art crucible lift system useful in the present invention.

Referring to FIG. 3, a crucible lifting and rotating mechanism 62 is shown. The apparatus of the invention functions to reduce vibrations originating in the mechanism 62 and transmitted through the mechanism 62. The crucible 64 is mounted on shaft 66 which extends through housing 68. The shaft 66, in turn, is connected to shaft 70 which is positioned within flexible bellows 72 and rests on bearings which are, in turn, supported by a sliding housing 100. Bellows 72 provides vacuum sealing and allows for the vertical motion of the housing 100.

Shaft 70 is rotated by motor 78 which drives an endless belt 88 around pulleys 90 and 92. Pulley 92 is in frictional contact with shaft 70 and causes shaft 70 to rotate when motor 78 is activated. The rotating shaft 70, in turn, causes crucible 64 to rotate. Hermetic sealing about shaft 70 is provided by ferrofluid seal 74.

A second motor 104 (shown partially cut away) rotates a threaded lift screw 98 causing screw follower 97 to move upward. The follower 97, in turn, moves housing 99 which is attached to housing 100. Housing 100 slides along three vertical stays (of which stay 110 is shown in FIG. 3) and lifts shaft 70 and crucible 64. The upper part of lift screw 98 is covered by flexible bellows 102 and the lower part by flexible bellows 94 (shown collapsed). Bellows 102 and 94 prevent dirt and extraneous material from interfering with the screw mechanism.

Figure 4:
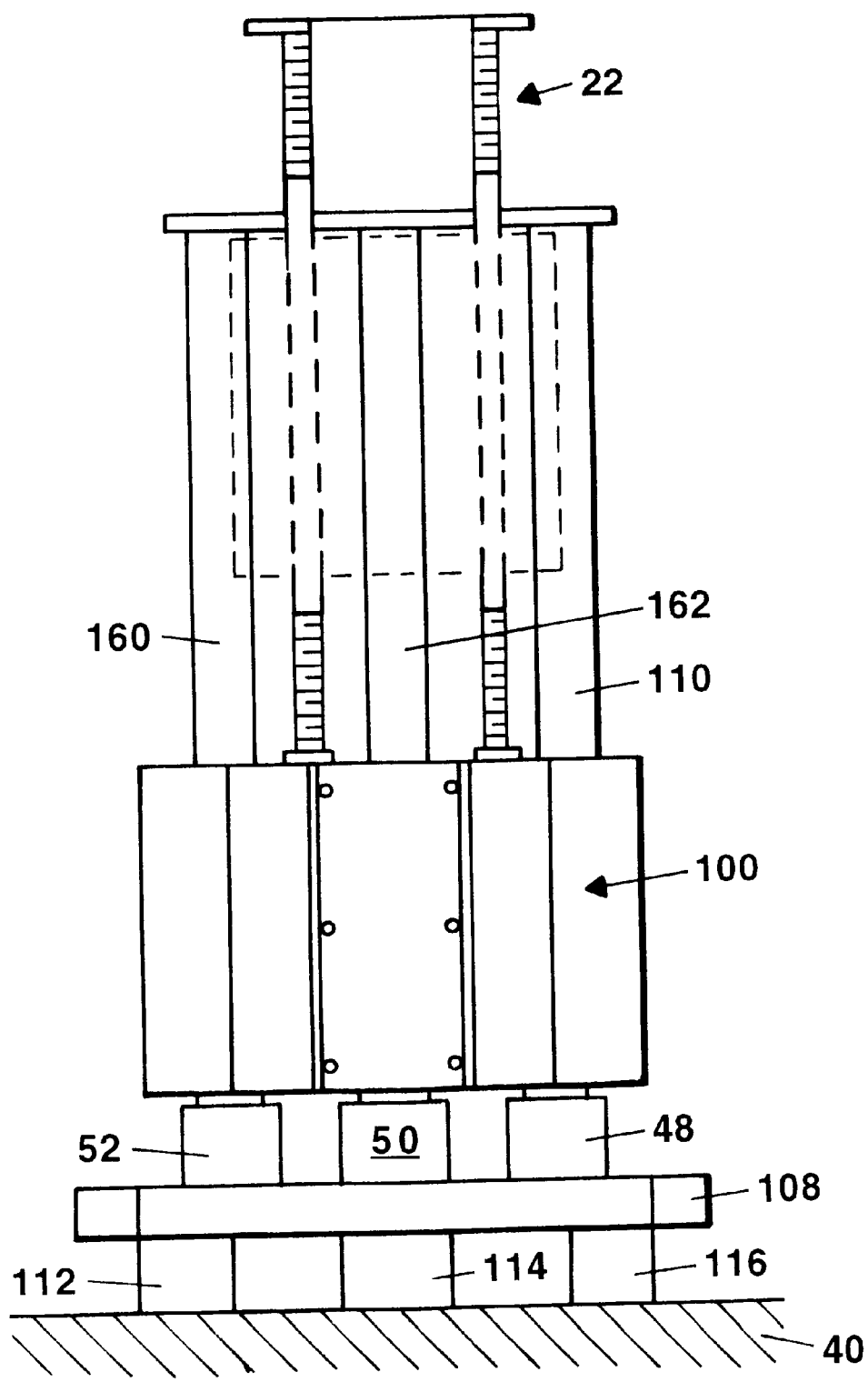
FIG. 4 is a side view of a crucible lift system with vibration isolators installed in accordance with the principles of the invention.
Figure 5:
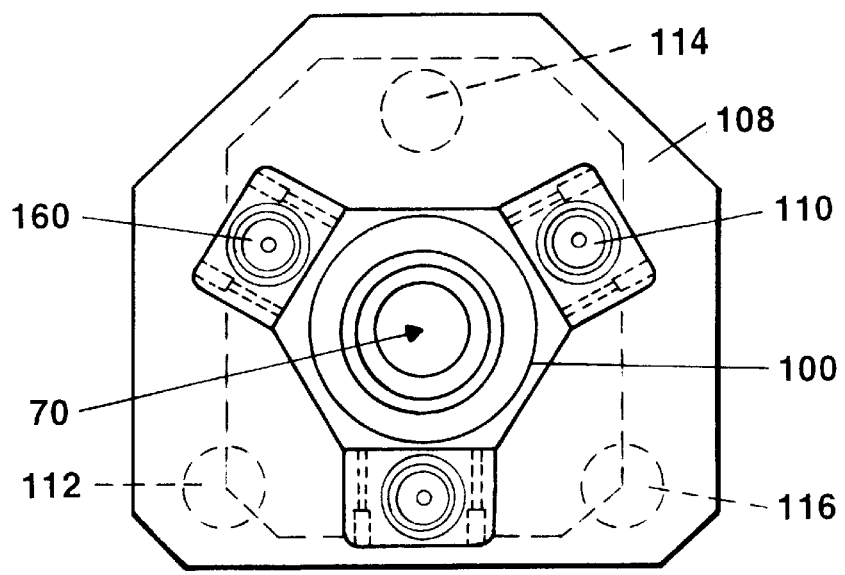
FIG. 5 is a top view of the platform on which the conventional crucible lift mechanism rests.

FIGS. 4 and 5 are schematic diagrams showing a side and top view of the crucible lift and rotation apparatus including the sliding housing 100. Housing 100 slides along stays 110, 130 and 132. Stays 110, 130 and 132 rest on supporting columns 48, 50 and 52. Supporting columns 48, 50 and 52, in turn, are mounted on base plate 108. In accordance with the principles of the invention, vibrations originating from the moving crucible 64, housing 100, motor 78 and motor 104 are isolated by vibration isolators 112, 114, and 116 are mounted between base plate 108 and the frame base 40.

Figure 6:
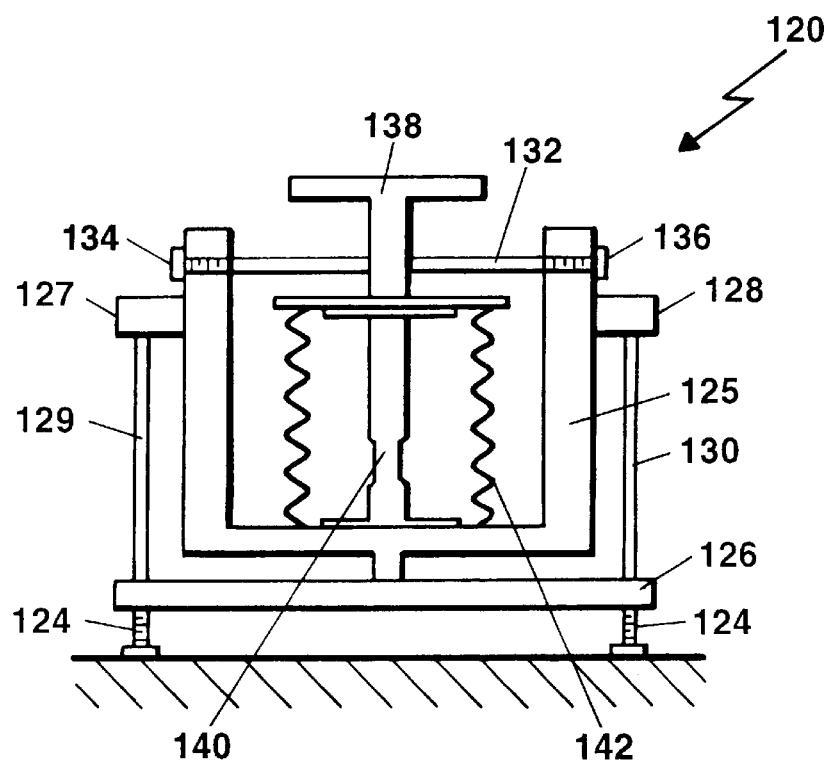
FIG. 6 is a cross-sectional view of a conventional vibration isolator useful in the present invention.

Referring to FIG. 6, a partial cross-sectional view of a conventional vibration isolator 120 is shown which is suitable for use with the present invention. The vibration isolator 120 has at least three leveling screws 124, which, in turn, support base 126. The isolator comprises a body 125 which is mounted on gimbals 127 and 128 which are supported by vertical supports 129 and 130. Vertical spring force is provided by a tensioned diaphragm 132 which can be preloaded, via tensioning screws 134 and 136. The load bearing support 138 is provided with vertical damping by means of a conventional oil-filled dashpot mechanism 140 which is protected by a flexible bellows 142. Vibration dampers which are suitable for use with the present invention are model 6-DOF vibration dampers manufactured and sold by Minus K Technology, located at 420 S. Hindry Avenue, Inglewood, Calif. 90301.

While the invention has been shown and described above with respect to various preferred embodiments, it will apparent that the foregoing and other changes of the form and detail may be made therein by one skilled in the art without departing from the spirit and scope of the invention.

What is claimed is:

1. An apparatus for use with a crystal growing system having a housing which rests on a supporting floor and a working portion for growing a solid crystal from a molten charge material, the apparatus isolating the crystal growing system from vibration and comprising:
   a base for supporting the housing; and
   at least one vibration isolator positioned between the base and the supporting floor.

2. The apparatus as recited in claim 1 further comprising at least three vibration isolators positioned between the base and the supporting floor.

3. The apparatus as recited in claim 1 further comprising at least one vibration isolator positioned between the base and the crystal growing system working portion.

4. The apparatus as recited in claim 1 further comprising at least three vibration isolators positioned between the base and the crystal growing system working portion.

5. An apparatus for use with a crystal growing system having a housing which rests on a supporting floor and a working portion for growing a solid crystal from a molten charge material, the apparatus isolating the crystal growing system from vibration and comprising:
   a base for supporting the housing; and
   at least one vibration isolator positioned between the base and the crystal growing system working portion.

6. The apparatus as recited in claim 5 further comprising at least three vibration isolators positioned between the base and the crystal growing system working portion.

7. The apparatus as recited in any of claims 1–6 wherein the vibration isolator isolates both horizontal and vertical vibration.

8. An apparatus for growing a solid crystal by pulling a seed crystal from a molten charge material in a crucible, the apparatus resting on a supporting floor and comprising:
   a housing for the solid crystal and the crucible;
   means for pulling the seed crystal within the housing under conditions to form the solid crystal; and
   at least one vibration isolator positioned between the housing and the supporting floor.

9. The apparatus of claim 8 further comprising a crucible lift and rotation mechanism and at least one vibration isolator positioned between the crucible lift and rotation mechanism and the supporting floor.

10. An apparatus for growing a solid crystal by pulling a seed crystal from a molten charge material in a crucible, the apparatus resting on a supporting floor and comprising:
    a housing for the solid crystal and the crucible;
    a crucible lift and rotation for lifting and rotating the crucible;
    means for pulling the seed crystal within the housing under conditions to form the solid crystal; and
    at least one vibration isolator positioned between the crucible lift and rotation mechanism and the supporting floor.

11. An apparatus for growing a solid crystal by pulling a seed crystal from a molten charge material in a crucible, the apparatus being supported by a frame which rests on a supporting floor and comprising:

a housing for the solid crystal and the crucible;

means for pulling the seed crystal within the housing under conditions to form the solid crystal; and at least one vibration isolator positioned between the pulling means and the frame.

12. The apparatus as recited in claim 11 further comprising at least one vibration isolator positioned between the frame and the supporting floor.

13. The apparatus as recited in claim 11 further comprising a crucible lift and rotation for lifting and rotating the crucible and at least one vibration isolator positioned between the crucible lift and rotation mechanism and the supporting floor.

14. The apparatus as recited in any of claims 8–13 wherein the vibration isolator isolates both horizontal and vertical vibration.

* * * * *